United States Patent
Iwase

(10) Patent No.: US 11,765,917 B2
(45) Date of Patent: Sep. 19, 2023

(54) ORGANIC THIN FILM TRANSISTOR AND METHOD OF MANUFACTURING ORGANIC THIN FILM TRANSISTOR

(71) Applicant: FUJIFILM Corporation, Tokyo (JP)

(72) Inventor: Eijiro Iwase, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 334 days.

(21) Appl. No.: 17/182,900

(22) Filed: Feb. 23, 2021

(65) Prior Publication Data

US 2021/0175449 A1 Jun. 10, 2021

Related U.S. Application Data

(63) Continuation of application No. PCT/JP2019/029955, filed on Jul. 31, 2019.

(30) Foreign Application Priority Data

Aug. 24, 2018 (JP) .................. 2018-157040

(51) Int. Cl.
*H01L 23/00* (2006.01)
*H10K 10/88* (2023.01)
(Continued)

(52) U.S. Cl.
CPC .......... *H10K 10/88* (2023.02); *H10K 10/466* (2023.02); *H10K 71/80* (2023.02)

(58) Field of Classification Search
CPC .............................. H10K 10/88; H10K 10/466
See application file for complete search history.

(56) References Cited

U.S. PATENT DOCUMENTS

2004/0026689 A1  2/2004  Bernds et al.
2007/0275181 A1  11/2007  Carcia et al.
(Continued)

FOREIGN PATENT DOCUMENTS

JP  2004-506985 A  3/2004
JP  2007-516347 A  6/2007
(Continued)

OTHER PUBLICATIONS

Extended European Seach Report for counterpart European Application No. 19852557.8, dated Sep. 24, 2021.
(Continued)

*Primary Examiner* — Anthony Ho
(74) *Attorney, Agent, or Firm* — Birch, Stewart, Kolasch & Birch, LLP

(57) ABSTRACT

Provided are an organic thin film transistor having high bendability and high stability in air and a method of manufacturing the organic thin film transistor. The organic thin film transistor includes: a gas barrier layer consisting of a resin layer and an inorganic layer; a transistor element that is formed on one main surface side of the gas barrier layer and includes a gate electrode, an insulating film, an organic semiconductor layer, a source electrode, and a drain electrode; and a sealing layer that is laminated on a side of the transistor element opposite to the gas barrier layer through an adhesive layer, in which a thickness of the resin layer in the gas barrier layer is less than a thickness ranging from the inorganic layer to the sealing layer in the gas barrier layer.

18 Claims, 4 Drawing Sheets

(51) Int. Cl.
*H10K 10/46* (2023.01)
*H10K 71/80* (2023.01)

(56) References Cited

U.S. PATENT DOCUMENTS

| | | | |
|---|---|---|---|
| 2013/0069045 A1 | 3/2013 | Otsuki et al. | |
| 2016/0359114 A1 | 12/2016 | Nakamura | |
| 2017/0117498 A1 | 4/2017 | Takechi et al. | |
| 2017/0315222 A1* | 11/2017 | Nakamura | G01S 13/42 |
| 2018/0163318 A1* | 6/2018 | Kamo | C23C 28/00 |

FOREIGN PATENT DOCUMENTS

| | | |
|---|---|---|
| JP | 2008-72087 A | 3/2008 |
| JP | 2010-152298 A | 7/2010 |
| JP | 2011-181590 A | 9/2011 |
| JP | 2017-43060 A | 3/2017 |
| JP | 2017-84846 A | 5/2017 |
| JP | 2017-98290 A | 6/2017 |
| WO | WO 2008/020566 A1 | 2/2008 |
| WO | WO 2015/133391 A1 | 9/2015 |
| WO | WO 2016/117534 A1 | 7/2016 |
| WO | WO 2017/026349 A1 | 2/2017 |

OTHER PUBLICATIONS

International Preliminary Report on Patentability and Written Opinion of the International Searching Authority with an English translation (forms PCT/IB/373, PCT/ISA/237 and PCT/IB/326), dated Mar. 11, 2021, for corresponding International Application No. PCT/JP2019/029955.
International Search Report (form PCT/ISA/210), dated Oct. 8, 2019, for corresponding International Application No. PCT/JP2019/029955, with an English translation.
Notice of Reasons for Refusal issued in corresponding Japanese Patent Application No. 2020-538262 dated Apr. 12, 2022, with English translation.

* cited by examiner

ORGANIC THIN FILM TRANSISTOR AND METHOD OF MANUFACTURING ORGANIC THIN FILM TRANSISTOR

CROSS-REFERENCE TO RELATED APPLICATIONS

This application is a Continuation of PCT International Application No. PCT/JP2019/029955 filed on Jul. 31, 2019, which claims priority under 35 U.S.C. § 119(a) to Japanese Patent Application No. 2018-157040 filed on Aug. 24, 2018. The above application is hereby expressly incorporated by reference, in its entirety, into the present application.

BACKGROUND OF THE INVENTION

1. Field of the Invention

The present invention relates to an organic thin film transistor and a method of manufacturing the organic thin film transistor.

2. Description of the Related Art

Unlike an inorganic semiconductor in the related art, an organic semiconductor is formed of organic molecules that are soluble in various solvents. Therefore, the organic semiconductor can be formed by application, a printing technique, or the like. Therefore, the organic semiconductor can be used for various devices that are manufactured using roll-to-roll (hereinafter, also referred to as "R-to-R"). Various organic thin film transistors formed of the organic semiconductor are disclosed.

As a general configuration of the organic thin film transistor, a gate electrode is formed on a substrate, an insulating film covers the gate electrode, an organic semiconductor layer is formed on the insulating film, and a source electrode and a drain electrode are formed on the organic semiconductor layer.

Many techniques of imparting flexibility to an organic thin film transistor by using an organic semiconductor as a semiconductor are disclosed. However, this flexible organic thin film transistor has two problems.

The first problem is breakage of a member forming a transistor element derived from bendability when a flexible organic thin film transistor is bent. A laminate structure of the transistor element has low adhesiveness between components and is likely to break during bending. Therefore, in order to prepare a flexible organic thin film transistor, a sealing structure that interpose a transistor element is required.

The second problem is that this sealing structure is required to have gas barrier properties. The organic semiconductor itself has high heat stability and is not likely to be affected by humidity. Therefore, the stability in air is relatively high. However, an interface between the organic semiconductor and the insulating film and an interface between the organic semiconductor and each of the electrodes are oxidized by moisture, and the number of electron traps increases. Therefore, electron leakage increases. Thus, in order to impart stability in air, the sealing structure is required to have gas barrier properties.

Due to the above-described two problems, a sealing structure formed of a material that has high bendability and can block moisture is required for the organic thin film transistor.

In order to solve the problems, a technique of sealing an organic thin film transistor with a gas barrier film is disclosed.

For example, JP2017-084846A describes a thin film device including: a resin film; a first inorganic layer and a thin film transistor that are formed in this order on one surface of the resin film; and a second inorganic layer that is formed on another surface of the resin film.

However, the above-described two problems cannot be sufficiently avoided with a configuration using a gas barrier film in which an inorganic layer is laminated on a resin film such as a polyethylene terephthalate (PET) film.

On the other hand, JP2017-043060A discloses a transfer type gas barrier film including: a substrate (separator); a peeling layer that is formed on a surface of the substrate; and a gas barrier layer that is formed on a surface of the peeling layer.

JP2017-043060A describes that the transfer type gas barrier film adheres to an adhesion target such as an organic EL element through an adhesive layer and the substrate is peeled such that the gas barrier film is transferred (peeled and transferred) to the adhesion target.

SUMMARY OF THE INVENTION

However, the transfer layer that is transferred by peeling the substrate from the transfer type gas barrier film described in JP2017-043060A has a configuration in which an organic layer formed of an acrylate resin or the like having a high glass transition temperature is formed on a peelable resin layer formed of a cycloolefin copolymer (COC) resin or the like and an inorganic layer formed of silicon nitride is formed on the organic layer.

The transfer layer not including the substrate has higher bendability than a plastic film. However, the organic layer that functions as an underlayer of the inorganic layer is required to have heat resistance during formation of the inorganic layer, and thus is formed of a material having a high glass transition temperature. The organic layer having a high glass transition temperature is hard, and thus has a limit on bendability. Therefore, a sealing unit having high bendability is further required for the organic thin film transistor.

An object of the present invention is to solve the problems and to provide an organic thin film transistor having high bendability and high stability in air and a method of manufacturing the organic thin film transistor.

The present invention achieves this object with the following configurations.

[1] An organic thin film transistor comprising:
a gas barrier layer consisting of a resin layer and an inorganic layer;
a transistor element that is formed on one main surface side of the gas barrier layer and includes a gate electrode, an insulating film, an organic semiconductor layer, a source electrode, and a drain electrode; and
a sealing layer that is laminated on a side of the transistor element opposite to the gas barrier layer through an adhesive layer,
in which a thickness of the resin layer in the gas barrier layer is less than a thickness ranging from the inorganic layer to the sealing layer in the gas barrier layer.

[2] The organic thin film transistor according to [1],
in which the sealing layer is a gas barrier layer consisting of a resin layer and an inorganic layer,
a thickness of the resin layer in at least one of the gas barrier layers on both sides of the transistor element is less than a thickness ranging from the inorganic layer of one gas barrier layer to the inorganic layer of another gas barrier layer.

[3] The organic thin film transistor according to [2], in which thicknesses of the resin layers in the gas barrier layers on both sides of the transistor element are less than the thickness ranging from the inorganic layer of one gas barrier layer to the inorganic layer of another gas barrier layer.

[4] The organic thin film transistor according to any one of [1] to [3], in which a substrate that is peelable from the gas barrier layer is provided on a surface of the gas barrier layer opposite to the transistor element.

[5] The organic thin film transistor according to any one of [1] to [4], in which a ratio of the thickness of the resin layer in the gas barrier layer to the thickness ranging from the inorganic layer to the sealing layer in the gas barrier layer is in a range of 0.01 to 0.9.

[6] The organic thin film transistor according to any one of [1] to [5], in which the inorganic layer of the gas barrier layer consists of silicon nitride.

[7] The organic thin film transistor according to any one of [1] to [6], in which a thickness of the inorganic layer in the gas barrier layer is 50 nm or less.

[8] The organic thin film transistor according to any one of [1] to [7], in which the thickness of the resin layer in the gas barrier layer is in a range of 0.1 μm to 2 μm.

[9] The organic thin film transistor according to any one of [1] to [8], in which a thickness of the adhesive layer is in a range of 2.1 μm to 10 μm.

[10] The organic thin film transistor according to any one of [1] to [9], in which a glass transition temperature of the resin layer in the gas barrier layer is 200° C. or higher.

[11] The organic thin film transistor according to any one of [1] to [10], in which the resin layer in the gas barrier layer includes a bisphenol structure.

[12] The organic thin film transistor according to any one of [1] to [11], in which the resin layer in the gas barrier layer includes polyarylate.

[13] A method of manufacturing an organic thin film transistor, the method comprising:

a transistor forming step of forming a transistor element on a first gas barrier layer of a transfer type gas barrier film including a substrate and the first gas barrier layer, the transistor element including a gate electrode, an insulating film, an organic semiconductor layer, a source electrode, and a drain electrode, the first gas barrier layer including a resin layer and an inorganic layer, the resin layer being peelable from the substrate, and the inorganic layer being formed on the resin layer;

a bonding step of bonding a transfer type gas barrier film including a substrate and a second gas barrier layer to the transistor element through an adhesive layer, the second gas barrier layer including a resin layer and an inorganic layer, the resin layer being peelable from the substrate, the inorganic layer being formed on the resin layer, and the transfer type gas barrier film being bonded such that the inorganic layer side faces the transistor element; and a peeling step of peeling the substrate from each of the two transfer type gas barrier films, in which in the bonding step, the transfer type gas barrier film is bonded such that at least one of a thickness of the resin layer in the first gas barrier layer or a thickness of the resin layer in the second gas barrier layer is less than a thickness ranging from the inorganic layer of the first gas barrier layer to the inorganic layer of the second gas barrier layer.

According to one aspect of the present invention, it is possible to provide an organic thin film transistor having high bendability and high stability in air and a method of manufacturing the organic thin film transistor.

DESCRIPTION OF THE PREFERRED EMBODIMENTS

Hereinafter, an embodiment of an organic thin film transistor according to the present invention and a method of manufacturing the organic thin film transistor will be described based on the drawings.

[Organic Thin Film Transistor]

An organic thin film transistor according to the embodiment of the present invention comprises:

a gas barrier layer consisting of a resin layer and an inorganic layer;

a transistor element that is formed on one main surface side of the gas barrier layer and includes a gate electrode, an insulating film, an organic semiconductor layer, a source electrode, and a drain electrode; and a sealing layer that is laminated on a side of the transistor element opposite to the gas barrier layer through an adhesive layer, in which a thickness of the resin layer in the gas barrier layer is less than a thickness ranging from the inorganic layer to the sealing layer in the gas barrier layer.

Figure 1:
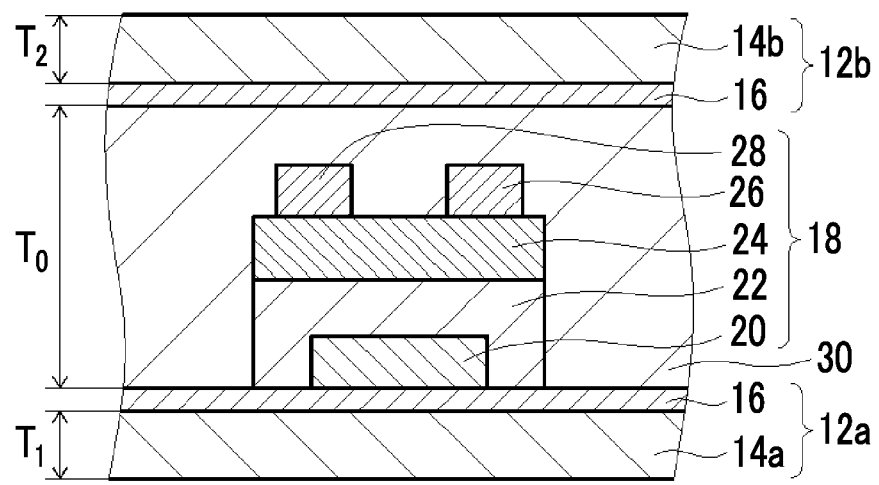
FIG. 1 is a cross-sectional view conceptually showing an example of an organic thin film transistor according to the present invention.

FIG. 1 conceptually shows one example of the organic thin film transistor according to the embodiment of the present invention.

FIG. 1 is a cross-sectional view schematically showing a cross-section of the organic thin film transistor according to the embodiment of the present invention in a direction perpendicular to a main surface. The main surface is the maximum surface of a sheet-shaped material (a film or a plate-shaped material).

An organic thin film transistor 10a shown in FIG. 1 includes a first gas barrier layer 12a, a transistor element 18, an adhesive layer 30, and a second gas barrier layer 12b.

In the following description, for convenience of description, it is assumed that the first gas barrier layer 12a side of the organic thin film transistor is the lower side, and the second gas barrier layer 12b side of the organic thin film transistor is the upper side.

The first gas barrier layer 12a consists of a first resin layer 14a and an inorganic layer 16 and exhibits gas barrier properties. The first gas barrier layer 12a is obtained by peeling a peelable substrate from a transfer type gas barrier film. This point will be described below.

The transistor element 18 is formed on the inorganic layer 16 of the first gas barrier layer 12a.

The transistor element 18 includes: a gate electrode 20 that is formed on a surface of the inorganic layer 16 in the first gas barrier layer 12a; an insulating film 22 that is formed to cover the gate electrode 20; an organic semiconductor layer 24 that is formed on the insulating film 22; and a source electrode 26 and a drain electrode 28 that are formed on the organic semiconductor layer 24 to be spaced from each other. That is, the transistor element 18 is a so-called bottom gate-top contact type transistor element.

The second gas barrier layer 12b is laminated on the transistor element 18 through the adhesive layer 30. That is, the transistor element 18 is embedded with the adhesive layer 30, and the second gas barrier layer 12b is laminated on the adhesive layer 30. The adhesive layer 30 is also in contact with a portion of the first gas barrier layer 12a where the transistor element 18 is not formed.

The adhesive layer 30 is formed of a resin that is solid at a normal temperature and flows during heating.

The second gas barrier layer 12b consists of a second resin layer 14b and an inorganic layer 16 and exhibits gas barrier properties. The second gas barrier layer 12b is obtained by peeling a peelable substrate from a transfer type gas barrier film. This point will be described below.

That is, the organic thin film transistor 10a has a configuration in which the transistor element 18 is sealed with the two gas barrier layers.

Here, the organic thin film transistor shown in FIG. 1 has a configuration in which a thickness $T_1$ of the first resin layer 14a in the first gas barrier layer 12a and a thickness $T_2$ of the second resin layer 14b in the second gas barrier layer 12b are less than a thickness $T_0$ ranging from the inorganic layer 16 in the first gas barrier layer 12a to the inorganic layer 16 in the second gas barrier layer 12b. The region where the transistor element 18 is not formed ranging from the inorganic layer 16 of the first gas barrier layer 12a to the inorganic layer 16 of the second gas barrier layer 12b is filled with the adhesive layer 30. In the following description, the thickness $T_0$ ranging from the inorganic layer 16 in the first gas barrier layer 12a to the inorganic layer 16 in the second gas barrier layer 12b will also be referred to as the thickness of the adhesive layer 30.

As described above, in the organic thin film transistor, in a case where the transistor element is sealed with the gas barrier film and the gas barrier film includes a resin film such as a PET film, the organic semiconductor layer and each of the electrodes forming the transistor element have a problem in that they are damaged without following the bending of the plastic film.

In addition, a transfer type gas barrier film in which a substrate is peelable from a gas barrier layer is disclosed, and the use of this transfer type gas barrier film may also be considered. However, the organic layer that functions as an underlayer of the inorganic layer is required to have heat resistance during formation of the inorganic layer. Therefore, the organic layer is formed of a material having a high glass transition temperature and has a limit on bendability. Therefore, a sealing unit having high bendability is further required for the organic thin film transistor.

On the other hand, in the present invention, by setting the thickness $T_1$ of the first resin layer 14a in the first gas barrier layer 12a and the thickness $T_2$ of the second resin layer 14b in the second gas barrier layer 12b to be less than the thickness $T_0$ of the adhesive layer 30 interposed between the gas barrier layers, the bendability of the organic thin film transistor can be improved. As a result, the bendability is high, the penetration of moisture is prevented, the stability in air is excellent, the damage of the transistor element can be suppressed, and an organic thin film transistor having excellent durability can be provided.

In the example shown in FIG. 1, the thickness $T_1$ of the first resin layer 14a in the first gas barrier layer 12a and the thickness $T_2$ of the second resin layer 14b in the second gas barrier layer 12b are set to be less than the thickness $T_0$ of the adhesive layer 30 interposed between the gas barrier layers. However, the present invention is not limited to this configuration, and at least one of the thickness $T_1$ or the thickness $T_2$ only has to be less than the thickness $T_0$ of the adhesive layer 30. From the viewpoint of further improving bendability, it is preferable that both the thickness $T_1$ and the thickness $T_2$ are less than the thickness $T_0$ of the adhesive layer 30.

As the thickness $T_1$ of the first resin layer 14a and the thickness $T_2$ of the second resin layer 14b decrease, the bendability can be improved. In addition, in a case where the thickness $T_0$ of the adhesive layer 30 is large to some extent, the bendability can be improved.

On the other hand, the first resin layer 14a and the second resin layer 14b function as an underlayer of the inorganic layer. Therefore, in order to form the dense inorganic layer 16 having no defects, it is necessary that the first resin layer 14a and the second resin layer 14b are embedded with unevenness and foreign matter on the surface of the substrate to make the surface where the inorganic layer 16 is formed flat. In addition, in a case where the substrate is peeled from the first gas barrier layer 12a and the second gas barrier layer 12b, it is necessary to maintain the mechanical strength such that they are not torn off during peeling. Therefore, it is necessary that the thickness $T_1$ of the first resin layer 14a and the thickness of the second resin layer 14b are large to some extent. In addition, from the viewpoint of obtaining sufficient adhesiveness, it is necessary that the thickness of the adhesive layer 30 is large to some extent.

In addition, from the viewpoint of realizing a reduction in the weight and thickness of the organic thin film transistor as a whole, it is preferable that the thickness $T_1$ of the first resin layer 14a, the thickness of the second resin layer 14b, and the thickness $T_0$ of the adhesive layer 30 are small.

From the above-described viewpoint, a ratio $T_1/T_0$ of the thickness $T_1$ of the first resin layer 14a to the thickness $T_0$ of the adhesive layer 30 is preferably 0.01 to 0.9, more preferably 0.05 to 0.6, and still more preferably 0.1 to 0.5.

Likewise, a ratio $T_2/T_0$ of the thickness $T_2$ of the second resin layer 14b to the thickness $T_0$ of the adhesive layer 30 is preferably 0.01 to 0.9, more preferably 0.05 to 0.6, and still more preferably 0.1 to 0.5.

Specifically, the thickness $T_1$ of the first resin layer 14a and the thickness $T_2$ of the second resin layer 14b are preferably in a range of 0.1 µm to 2 µm, more preferably in a range of 0.5 µm to 1.5 µm, and still more preferably in a range of 0.7 µm to 1 µm.

In addition, the thickness $T_0$ of the adhesive layer is preferably in a range of 0.1 µm to 10 µm, more preferably in a range of 2.1 µm to 10 µm, and still more preferably in a range of 3 µm to 5 µm.

Figure 2:
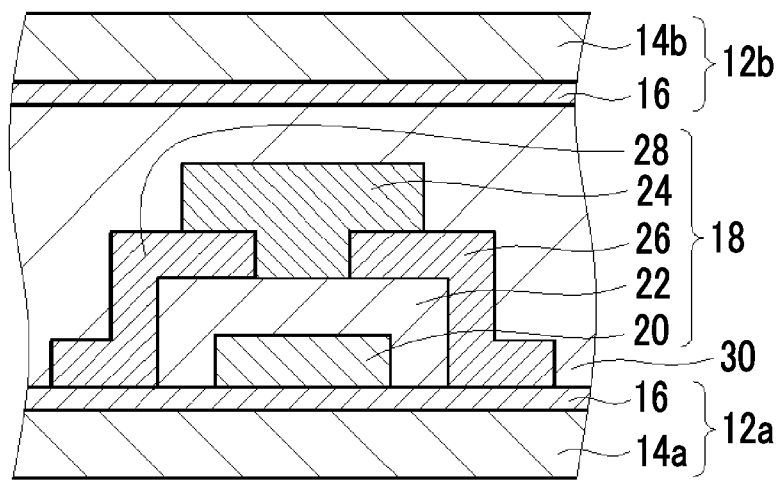
FIG. 2 is a cross-sectional view conceptually showing another example of the organic thin film transistor according to the present invention.

Here, in the example shown in FIG. 1, the transistor element 18 is a so-called bottom gate-top contact type transistor element, but the present invention is not limited thereto. For example, as in an organic thin film transistor 10b shown in FIG. 2, the transistor element 18 may be a so-called bottom gate-bottom contact type transistor element in which the gate electrode 20, the source electrode 26, and the drain electrode 28 are positioned below the organic semiconductor layer 24. Alternatively, the transistor element 18 may be a so-called top gate-top contact type transistor element in which the gate electrode 20, the source electrode 26, and the drain electrode 28 are positioned above the organic semiconductor layer 24, or may be a top gate-bottom contact type transistor element in which the gate electrode 20 is positioned above the organic semiconductor layer 24 and the source electrode 26 and the drain electrode 28 are positioned below the organic semiconductor layer 24.

Figure 3:
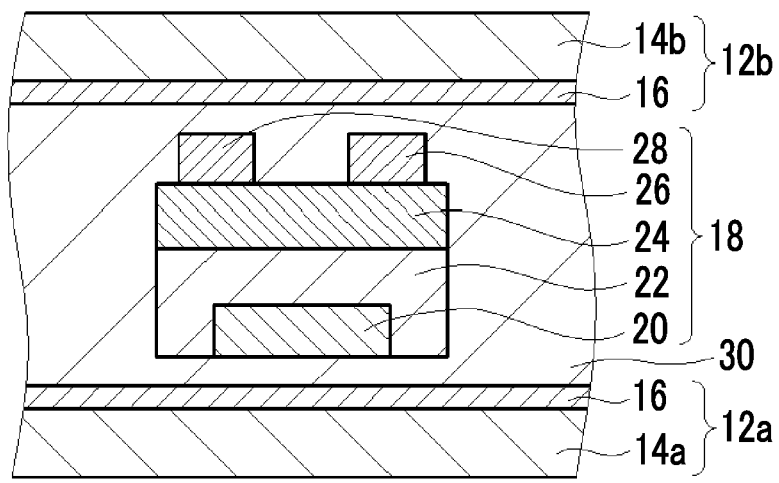
FIG. 3 is a cross-sectional view conceptually showing still another example of the organic thin film transistor according to the present invention.

In addition, in the example shown in FIG. 1, the transistor element 18 is formed in contact with the inorganic layer 16 of the first gas barrier layer 12a, but the present invention is not limited thereto. For example, as in an organic thin film transistor 10c shown in FIG. 3, the adhesive layer 30 may be provided between the transistor element 18 and the inorganic layer 16 of the first gas barrier layer 12a.

In addition, as described above, the first gas barrier layer 12a and the second gas barrier layer 12b are layers transferred from the transfer type gas barrier films. Therefore, in a case where the organic thin film transistor is used, the substrate is peeled as shown in FIG. 1. However, for example, during transport or the like, a substrate 32 may be laminated as in an organic thin film transistor 10d shown in FIG. 4.

Figure 4:
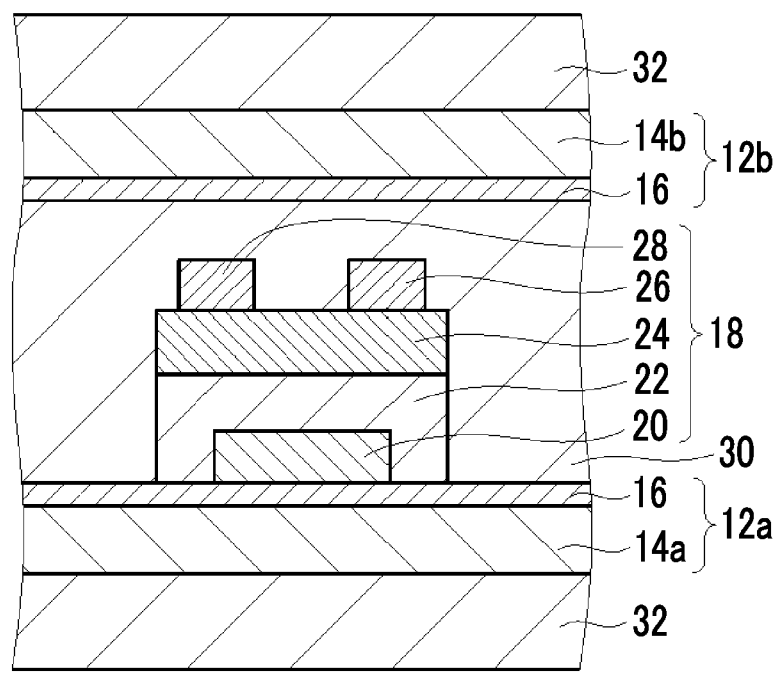
FIG. 4 is a cross-sectional view conceptually showing still another example of the organic thin film transistor according to the present invention.

The organic thin film transistor 10d shown in FIG. 4 has the same configuration as the organic thin film transistor 10a shown in FIG. 1, except that it includes the substrate 32 that is laminated on a surface of the first gas barrier layer 12a opposite to the transistor element and the substrate 32 that is laminated on a surface of the second gas barrier layer 12b opposite to the transistor element. Each of the substrates 32 is laminated to be peelable from the first gas barrier layer 12a or the second gas barrier layer 12b.

In addition, in the example shown in FIG. 1, both the upper side and the lower side of the transistor element 18 are sealed with the gas barrier layer 12, but the present invention is not limited thereto. Among the upper side and the lower side of the transistor element 18, at least one side may be sealed with the gas barrier layer 12, and another one side may be sealed with a well-known sealing layer or support in the related art used for an organic thin film transistor, for example, a polyethylene naphthalate (PEN) substrate, a cycloolefin polymer (COP), or a polyimide (PI).

Specifically, the lower side of the transistor element 18, that is, the surface where the transistor element 18 is to be formed may be sealed with the gas barrier layer 12, and the upper side of the transistor element 18 may be sealed with a well-known sealing layer in the related art through the adhesive layer 30. Alternatively, the surface where the transistor element 18 is to be formed may be sealed with a support (sealing layer) for a well-known transistor element in the related art, and the upper side of the transistor element 18 may be sealed with the gas barrier layer 12 through the adhesive layer 30.

Hereinafter, the portion forming the organic thin film transistor will be described in detail.

In the following description, in a case where it is not necessary to distinguish between the first gas barrier layer 12a and the second gas barrier layer 12b, the first gas barrier layer 12a and the second gas barrier layer 12b will be collectively referred to as the gas barrier layer 12. Likewise, in a case where it is not necessary to distinguish between the first resin layer 14a and the second resin layer 14b, the first resin layer 14a and the second resin layer 14b will be collectively referred to as the resin layer 14.

<Substrate (Separator)>

As the substrate 32, a well-known sheet-shaped material (a film or a plate-shaped material) that is used as a substrate (support) for various gas barrier films, various laminated functional films, and the like can be used.

In addition, as the substrate 32, various sheet-shaped materials that are used as separators (a light peeling separator and a heavy peeling separator) for various optical clear adhesives (OCA) can also be used.

As a material of the substrate 32, for example, various materials that can form the resin layer 14, the inorganic layer 16, the adhesive layer 30, and the transistor element 18 and are insoluble in a solvent in a composition for forming the resin layer 14 can be used. Preferable examples of the material of the substrate 32 include various resin materials.

Examples of the material of the substrate 32 include polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, polymethyl methacrylate resin (PMMA), polycarbonate (PC), polyacrylate, polymethacrylate, polypropylene (PP), polystyrene (PS), an acrylonitrile-butadiene-styrene copolymer (ABS), a cycloolefin copolymer (COC), a cycloolefin polymer (COP), triacetyl cellulose (TAC), and an ethylene-vinyl alcohol copolymer (EVOH).

The thickness of the substrate 32 can be appropriately set depending on the use, the material, and the like.

The thickness of the substrate 32 is not particularly limited and is preferably 5 to 150 µm and more preferably 10 to 100 µm from the viewpoints that, for example, the mechanical strength of the transfer type gas barrier film can be sufficiently secured, a transfer type gas barrier film having excellent flexibility can be obtained, a reduction in the weight and thickness of the transfer type gas barrier film can be realized, the substrate can be easily peeled from the gas barrier layer 12 during transfer, and the transfer type gas barrier film can be obtained.

<Resin Layer>

The resin layer 14 forms the gas barrier layer 12 and functions as an underlayer for appropriately forming the inorganic layer 16. In addition, the resin layer 14 peelably adheres to the substrate 32. That is, the resin layer 14 is peelable from the substrate 32. Accordingly, the adhesive strength between the resin layer 14 and the inorganic layer 16 is stronger than the adhesive strength between the substrate 32 and the resin layer 14.

Although described below, the inorganic layer 16 to be formed on the surface of the resin layer 14 is preferably formed by plasma chemical vapor deposition (CVD). Therefore, in a case where the inorganic layer 16 is formed, the resin layer 14 is etched by plasma, and a mixed layer or the like including a component of the resin layer 14 and a component of the inorganic layer 16 is formed between the resin layer 14 and the inorganic layer 16. As a result, the resin layer 14 and the inorganic layer 16 adheres to each other with a very strong adhesive strength.

Accordingly, the adhesive strength between the resin layer 14 and the inorganic layer 16 is much stronger than the adhesive strength between the substrate 32 and the resin layer 14, and even in a case where the substrate 32 is peeled from the resin layer 14, the resin layer 14 and the inorganic layer 16 are not peeled from each other.

The thickness of the resin layer 14 refers to the thickness of a layer consisting of only the components forming the resin layer 14 without including the above-described mixed layer.

In addition, since the resin layer 14 is an underlayer for appropriately forming the inorganic layer 16, the resin layer 14 formed on the surface of the substrate 32 is embedded with unevenness of the surface of the substrate 32 and foreign matter and the like attached to the surface. As a result, the formation surface of the inorganic layer 16 can be appropriately adjusted, and the inorganic layer 16 can be appropriately formed.

By forming the inorganic layer 16 on the resin layer 14 from which the substrate 32 is peelable, the transfer type gas barrier film in which the substrate 32 is peelable is realized.

Further, the resin layer 14 acts as a protective layer that protects the inorganic layer 16 after the substrate 32 is peeled.

During the formation of the inorganic layer 16, a high temperature is applied to the resin layer 14. Therefore, it is preferable that the resin layer 14 has high heat resistance. Specifically, the glass transition point (Tg) of the resin layer 14 is preferably 175° C. or higher, more preferably 200° C. or higher, and still more preferably 250° C. or higher.

As described above, it is preferable that the inorganic layer 16 formed on the surface of the resin layer 14 formed by plasma CVD. It is preferable that Tg of the resin layer 14 is 180° C. or higher from the viewpoints that, for example, the etching and volatilization of the resin layer 14 by plasma during the formation of the inorganic layer 16 can be suitably suppressed, and the appropriate resin layer 14 and the appropriate inorganic layer 16 can be formed.

The upper limit of Tg of the resin layer 14 is not particularly limited and is preferably 500° C. or lower.

In addition, due to the same reason as that of Tg, it is preferable that a resin forming the resin layer 14 has a high molecular weight to some extent.

Specifically, the molecular weight (weight-average molecular weight (Mw) of the resin forming the resin layer 14 is preferably 500 or higher, more preferably 1000 or higher, and still more preferably 1500 or higher.

Tg of the resin layer 14 may be specified with a well-known method using a differential scanning calorimeter (DSC) or the like. In addition, the molecular weight may also be measured with a well-known method using gel permeation chromatography (GPC) or the like. In addition, in a case where a commercially available product is used, catalog values may be used as Tg and the molecular weight of the resin layer 14.

Regarding this point, the same can also be applied to the adhesive layer 30 described below.

As a material for forming the resin layer 14, various resin layers (organic layers) that can be used as an underlayer of an inorganic layer in a well-known gas barrier film can be used. The resin layer 14 is formed of, for example, an organic compound obtained by polymerization (crosslinking or curing) of a monomer, a dimer, an oligomer, or the like. The composition for forming the resin layer 14 may include only one organic compound or two or more organic compounds.

The resin layer 14 includes, for example, a thermoplastic resin and an organic silicon compound. Examples of the thermoplastic resin include polyester, a (meth)acrylic resin, a methacrylic acid-maleic acid copolymer, polystyrene, a transparent fluororesin, polyimide, fluorinated polyimide, polyamide, polyamide imide, polyether imide, cellulose acylate, polyurethane, polyether ether ketone, polycarbonate, an alicyclic polyolefin, polyarylate, polyethersulfone, polysulfone, fluorene ring-modified polycarbonate, alicyclic-modified polycarbonate, fluorene ring-modified polyester, and an acrylic compound. Examples of the organic silicon compound include polysiloxane.

From the viewpoints of high strength and glass transition point, it is preferable that the resin layer 14 includes a polymer of a radically curable compound and/or a cationically curable compound having an ether group.

From the viewpoint of reducing the refractive index of the resin layer 14, it is preferable that the resin layer 14 includes a (meth)acrylic resin including, as a major component, a polymer of a monomer, an oligomer, or the like of (meth) acrylate. By reducing the refractive index of the resin layer 14, transparency increases, and light-transmitting property is improved.

It is more preferable that the resin layer 14 includes a (meth)acrylic resin including, as a major component, a monomer, a dimer, an oligomer, or the like of a bifunctional or higher (meth)acrylate such as dipropylene glycol di(meth)acrylate (DPGDA), trimethylolpropane tri(meth)acrylate (TMPTA), or dipentaerythritol hexa(meth)acrylate (DPHA), and it is still more preferable that the resin layer 14 includes a (meth)acrylic resin including, as a major component, a polymer of a monomer, a dimer, an oligomer, or the like of a trifunctional or higher (meth)acrylate. In addition, a plurality of (meth)acrylic resins may be used. The major component refers to a component having the highest content mass ratio among components included.

In addition, by forming the resin layer 14 using a resin having an aromatic ring, the substrate 32 can be made peelable.

It is preferable that the resin layer 14 includes, as a major component, a resin including a bisphenol structure. It is preferable that the resin layer 14 includes, as a major component, polyarylate (polyarylate resin (PAR). As is well known, the polyarylate is an aromatic polyester consisting of a polycondensate of a divalent phenol such as bisphenol represented by bisphenol A and a dibasic acid such as phthalic acid (terephthalic acid or isophthalic acid).

The resin layer 14 includes a resin including a bisphenol structure as a major component, in particular, polyarylate as a major component such that the adhesive strength between the substrate 32 and the resin layer 14 is appropriate and the substrate 32 can be easily peeled. In addition, this configuration is preferable from the viewpoints that, for example, the damage (for example cracking or fracturing) of the inorganic layer 16 can be prevented due to appropriate flexibility during the peeling of the substrate 32, the appropriate inorganic layer 16 can be stably formed due to high heat resistance, deterioration in performance after transfer can be prevented, and the bendability of the organic thin film transistor can be improved.

The major component refers to a component having the highest content mass ratio among components included.

In a case where the resin layer 14 is formed of various resins having an aromatic ring, the resin layer 14 may be formed of a commercially available product as long as the commercially available product is a resin having an aromatic ring.

Examples of the commercially available resin for forming the resin layer 14 include UNIFINER (registered trade name) and U-POLYMER (registered trade name) manufactured by Unitika Ltd. and NEOPULIM (registered trade name) manufactured by Mitsubishi Gas Chemical Company Inc.

The resin layer 14 can be formed with a well-known method depending on materials.

For example, the resin layer 14 can be formed with an application method including: dissolving a resin (organic compound) for forming the resin layer 14 in a solvent to prepare a composition (resin composition); applying the composition to the substrate 32; and drying the composition. During the formation of the resin layer 14 using the application method, the resin (organic compound) in the composition may be polymerized (crosslinked) by further irradiating the dried composition with ultraviolet light.

It is preferable that the composition for forming the resin layer 14 includes an organic solvent, a surfactant, and a silane coupling agent in addition to the organic compound.

It is preferable that the resin layer 14 is formed by roll-to-roll. In the following description, "roll-to-roll" will also be referred to as "R-to-R".

As is well known, R-to-R is a manufacturing method including: unwinding a sheet-shaped material from a roll around which an elongated sheet-shaped material is wound; performing film formation while transporting the elongated sheet in a longitudinal direction; and winding the sheet-shaped material on which the film is formed again in a roll shape. By using R-to-R, high productivity and production efficiency can be obtained.

The first resin layer 14a of the first gas barrier layer 12a and the second resin layer 14b of the second gas barrier layer 12b may be formed of the same material or different materials. In addition, the thicknesses may also be the same as or different from each other.

In addition, it is necessary that the resin layer 14 is formed to be peelable from the substrate 32. Therefore, as described above, a material having peelability may be used as the material of the resin layer 14, and a peeling layer may be provided between the resin layer 14 and the substrate 32. As the peeling layer, a well-known peeling layer in the release layer can be appropriately used.

<Inorganic Layer>

The inorganic layer 16 is a thin film including an inorganic compound and is formed at least on a surface of the resin layer 14. In the gas barrier layer 12, mainly, the inorganic layer 16 exhibits gas barrier performance.

The surface of the substrate 32 includes a region such as unevenness or foreign matter to which the inorganic compound is not likely to adhere. As described above, by forming the resin layer 14 on the surface of the substrate 32 and the inorganic layer 16 thereon, the region to which the inorganic compound is not likely to adhere is covered. Therefore, the inorganic layer 16 can be formed on the formation surface of the inorganic layer 16 without a gap.

A material of the inorganic layer 16 is not particularly limited, and various inorganic compounds that are used for a well-known gas barrier layer formed of an inorganic compound exhibiting gas barrier performance can be used.

Examples of a material of the inorganic layer 16 include inorganic compounds, for example, a metal oxide such as aluminum oxide, magnesium oxide, tantalum oxide, zirconium oxide, titanium oxide, or indium tin oxide (ITO); a metal nitride such as aluminum nitride; a metal carbide such as aluminum carbide; a silicon oxide such as silicon oxide, silicon oxynitride, silicon oxycarbide, or silicon oxynitride-carbide; a silicon nitride such as silicon nitride or silicon nitride-carbide; a silicon carbide such as silicon carbide; a hydride thereof; a mixture of two or more kinds thereof; and a hydrogen-containing material thereof. In addition, a mixture of two or more kinds of the examples can be used.

In particular, silicon nitride, silicon oxide, silicon oxynitride, aluminum oxide, or a mixture of two or more kinds thereof is preferably used from the viewpoints that transparency is high and excellent gas barrier performance can be exhibited. In particular, a compound including silicon is preferably used, and silicon nitride is more preferably used from the viewpoint that excellent gas barrier performance can be exhibited.

The thickness of the inorganic layer 16 is not particularly limited and can be appropriately set depending on materials such that desired gas barrier performance can be exhibited.

The thickness of the inorganic layer 16 is preferably 50 nm or less, more preferably 5 to 50 nm, and still more preferably 10 to 30 nm.

It is preferable that the thickness of the inorganic layer 16 is 2 nm or more from the viewpoint that the inorganic layer 16 exhibiting sufficient gas barrier performance can be formed. In addition, in a case where the inorganic layer 16 is generally brittle and is excessively thick, cracking, fracturing, peeling, or the like may occur. However, by adjusting the thickness of the inorganic layer 16 to be 50 nm or less, the occurrence of cracking can be prevented.

The inorganic layer 16 of the first gas barrier layer 12a and the inorganic layer 16 of the second gas barrier layer 12b may be formed of the same material or different materials. In addition, the thicknesses may also be the same as or different from each other.

The inorganic layer 16 can be formed with a well-known method depending on materials.

For example, plasma CVD such as capacitively coupled plasma (CCP)-CVD or inductively coupled plasma (ICP)-CVD, atomic layer deposition (ALD), sputtering such as magnetron sputtering or reactive sputtering, or various vapor deposition methods such as vacuum deposition can be suitably used.

In particular, as described above, from the viewpoint of improving the adhesive strength between the resin layer 14 and the inorganic layer 16, plasma CVD such as CCP-CVD or ICP-CVD can be preferably used.

It is also preferable that the inorganic layer 16 is formed by R-to-R.

<Adhesive Layer>

The adhesive layer 30 is to bond the second gas barrier layer 12b to the first gas barrier layer 12a in which the transistor element 18 is formed. The adhesive layer 30 is formed between the first gas barrier layer 12a and the second gas barrier layer 12b to embed the transistor element 18.

In addition, the adhesive layer 30 also acts as a protective layer that protects the inorganic layer 16 exhibiting gas barrier performance.

In the organic thin film transistor 10 according to the embodiment of the present invention, the adhesive layer 30 may be an optical clear adhesive (OCA) that is used for a transfer type gas barrier film in the related art or may be an adhesive layer formed of a hot melting adhesive (HMA). Specifically, the hot melting adhesive layer is an adhesive layer that is solid at a normal temperature and flows to exhibit adhesiveness during heating. In the present invention, the normal temperature refers to 23° C.

By using the hot melting adhesive as the adhesive layer 30, gas barrier performance can be further improved as compared to a transfer type gas barrier film in the related art.

In a case where the hot melting adhesive is used, it is preferable that the adhesive layer 30 flows to exhibit adhesiveness at 30° C. to 200° C., it is more preferable that the adhesive layer 30 flows to exhibit adhesiveness at 40° C. to 180° C., and it is still more preferable that the adhesive layer 30 flows to exhibit adhesiveness at 50° C. to 150° C.

In a case where the adhesive layer 30 flows to exhibit adhesiveness at a normal temperature, the above-described foil peeling is likely to occur during the cutting and transfer of the gas barrier film, and deterioration in gas barrier performance occurs.

In addition, in a case where the temperature at which the adhesive layer flows to exhibit adhesiveness is excessively high, a heating temperature required for adhesion to an adhesion target increases, and thermal damage is applied to the substrate 32, the resin layer 14, and the adhesion target.

In a case where the hot melting adhesive is used, Tg of the adhesive layer 30 is not particularly limited and is preferably 130° C. or lower, more preferably 100° C. or lower, still more preferably 60° C. or lower, and still more preferably 30° C. or lower.

It is preferable that Tg of the adhesive layer 30 is 130° C. or lower from the viewpoints that, for example, since heat fluidity can be easily obtained, adhesiveness and transfer characteristics during heating are improved, the above-described foil peeling can be prevented, adhesion can be performed at a low temperature, and productivity can be improved.

The lower limit of Tg of the adhesive layer 30 is not particularly limited and is preferably −150° C. or higher.

In a case where the hot melting adhesive is used, a material of the adhesive layer 30 is not particularly limited as long as it is solid at a normal temperature and flows to exhibit adhesiveness during heating.

In a case where the hot melting adhesive is used, it is preferable that the adhesive layer 30 includes an amorphous resin as a major component, it is more preferable that the adhesive layer 30 includes an acrylic resin as a major component, and it is still more preferable that the adhesive layer 30 includes a resin (acrylic homopolymer (homo-acrylic polymer) obtained by polymerization of a single acrylate monomer as a major component.

It is preferable that the adhesive layer 30 includes an amorphous resin, in particular, an acrylic resin as the major component from the viewpoint that, for example, a gas barrier film having high transparency can be obtained.

Further, it is preferable that the adhesive layer 30 includes an acrylic homopolymer as the major component not only in consideration of the above-described advantageous effects but also from the viewpoints that, for example, transfer characteristics by heat can be improved, foil peeling can be prevented, and blocking can be suppressed during winding after curing. In addition, by forming the adhesive layer 30 using the acrylic homopolymer, in addition to the above-described advantageous effects, the adhesive layer 30 can be made flow to exhibit adhesiveness at a relatively low temperature. Accordingly, in a case where high heat resistance is not required for the gas barrier film, the adhesive layer 30 formed of the acrylic homopolymer is suitably used.

In a case where the hot melting adhesive is used, various well-known resins or commercially available products can be used as long as they can form the adhesive layer 30 that is solid at a normal temperature and flows to exhibit adhesiveness during heating.

Specifically 0415BA (acrylic homopolymer) and #7000 series manufactured by Taisei Fine Chemical Co., Ltd. can be used.

Optionally, the adhesive layer 30 may include one or more selected from the group consisting of a styrene acrylic copolymer (styrene-modified acrylic resin), an urethane acrylic copolymer (urethane-modified acrylic resin), and an acrylic resin for adjusting the glass transition point.

By adding these components to the adhesive layer 30, Tg of the adhesive layer 30 can be improved. Accordingly, in a case where heat resistance is required for the organic thin film transistor depending on the use and the like, the adhesive layer 30 to which the above-described components are added is suitably used.

In addition, by adding a styrene acrylic copolymer to the adhesive layer 30, the hardness of the adhesive layer 30 can be adjusted, and a balance with the hardness of the adhesion target can be adjusted. By adding an urethane acrylic copolymer to the adhesive layer 30, the adhesiveness with the inorganic layer 16 can be improved.

The addition amounts of the components are not particularly limited and may be appropriately determined depending on the components to be added and desired Tg. However, it is preferable that the addition amounts of the components are adjusted such that the major component of the adhesive layer 30 is the amorphous resin, the acrylic resin, or the like described above.

The styrene acrylic copolymer, the urethane acrylic copolymer, and the acrylic resin for adjusting the glass transition point are not particularly limited, and various resins that are used for adjusting Tg of a resin or the like can be used. In addition, as the components, a commercially available product can also be used.

Examples of the styrene acrylic copolymer include #7000 series manufactured by Taisei Fine Chemical Co., Ltd.

Examples of the urethane acrylic copolymer include ACRYT (registered trade name) 8UA series manufactured by Taisei Fine Chemical Co., Ltd., for example, ACRYT 8UA347H.

Examples of the acrylic resin for adjusting the glass transition point include PMMA (DIANAL (registered trade name) manufactured by Mitsubishi Chemical Corporation.

<Gate Electrode>

As the gate electrode 20, a well-known electrode in the related art that is used as a gate electrode for an organic thin film transistor can be used.

Examples of a material and a method for forming the gate electrode 20 include a material and a forming method described in paragraphs "0049" to "0051" of JP2015-170760A.

The thickness of the gate electrode 20 may be any value and is preferably 1 nm or more and more preferably 10 nm or more. In addition, the thickness of the gate electrode 20 is preferably 500 nm or less and more preferably 200 nm or less.

<Source Electrode and Drain Electrode>

The source electrode 26 is an electrode to which a current flows from the outside through a wiring in the organic thin film transistor. The drain electrode 28 is an electrode from which a current flows to the outside through a wiring, and is typically provided in contact with the organic semiconductor layer 24.

Examples of materials and methods for forming the source electrode 26 and the drain electrode 28 include the same material and the same forming method as those of the gate electrode. In addition, a forming method described in paragraphs "0163" and "0164" of JP2015-170760A can also be used.

The thickness of each of the source electrode 26 and the drain electrode 28 may be any value and is preferably 1 nm or more and more preferably 10 nm or more. In addition, the thickness of each of the source electrode 26 and the drain electrode 28 is preferably 500 nm or less and more preferably 300 nm or less.

<Insulating Film>

The insulating film 22 is not particularly limited as long as it is an insulating layer and may have a single-layer structure or a multi-layer structure.

Examples of a material and a method for forming the insulating film 22 include a material and a forming method described in paragraphs "0053" to "0062" of JP2015-170760A.

The thickness of the insulating film 22 may be any value and is preferably 0.2 µm or more and more preferably 0.5 µm or more. The thickness of the insulating film 22 is preferably 5 µm or less and more preferably 2 µm or less.

<Organic Semiconductor Layer>

The organic semiconductor layer 24 exhibits semiconductivity and can accumulate carriers. The organic semiconductor layer 24 may be a layer including an organic semiconductor.

Examples of a material and a method for forming the organic semiconductor layer 24 include a material and a forming method described in paragraphs "0063" to "0160" of JP2015-170760A. In addition, as the material for forming the organic semiconductor layer 24, an organic semiconductor described in JP2015-195361A and an organic semiconductor described in JP2018-006745A can also be used.

The thickness of the organic semiconductor layer 24 may be any value and is preferably 0.001 µm or more and more preferably 0.01 µm or more. The thickness of the organic semiconductor layer 24 is preferably 1 µm or less and more preferably 0.5 µm or less.

[Method of Manufacturing Organic Thin Film Transistor]

A method of manufacturing an organic thin film transistor according to the embodiment of the present invention comprises:

a transistor forming step of forming a transistor element on a first gas barrier layer of a transfer type gas barrier film including a substrate and the first gas barrier layer, the transistor element including a gate electrode, an insulating film, an organic semiconductor layer, a source electrode, and a drain electrode, the first gas barrier layer including a resin layer and an inorganic layer, the resin layer being peelable from the substrate, and the inorganic layer being formed on the resin layer;

a bonding step of bonding a transfer type gas barrier film including a substrate and a second gas barrier layer to the transistor element through an adhesive layer, the second gas barrier layer including a resin layer and an inorganic layer, the resin layer being peelable from the substrate, the inorganic layer being formed on the resin layer, and the transfer type gas barrier film being bonded such that the inorganic layer side faces the transistor element; and a peeling step of peeling the substrate from each of the two transfer type gas barrier films, in which in the bonding step, the transfer type gas barrier film is bonded such that the thickness $T_1$ of the resin layer in the first gas barrier layer is less than the thickness $T_0$ ranging from the inorganic layer of the first gas barrier layer to the inorganic layer of the second gas barrier layer.

Hereinafter, an example of the method of manufacturing the organic thin film transistor according to the embodiment of the present invention will be described with reference to the conceptual diagrams shown in FIGS. 5 to 8.

Figure 5:
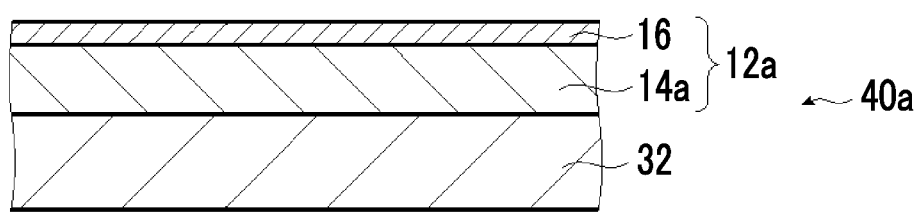
FIG. 5 is a diagram showing one example of a method of manufacturing the organic thin film transistor according to the present invention.

First, a transfer type gas barrier film 40a including the substrate 32 and the first gas barrier layer 12a as shown in FIG. 5 is prepared, the first gas barrier layer 12a including the first resin layer 14a and the inorganic layer 16. In the transfer type gas barrier film 40a, the substrate 32 is peelable from the first gas barrier layer 12a.

The transfer type gas barrier film 40a can be prepared by forming the first resin layer 14a on the substrate 32 using the above-described method and forming the inorganic layer 16 on the first resin layer 14a using the above-described method.

Figure 6:
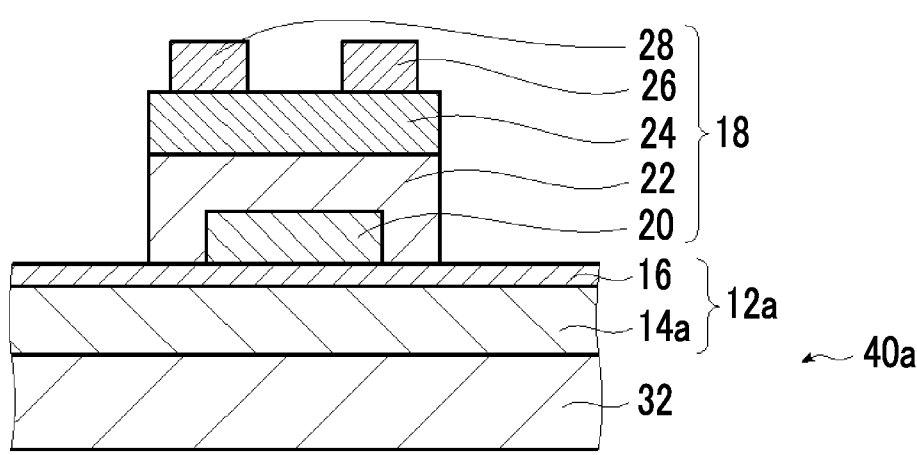
FIG. 6 is a diagram showing the example of the method of manufacturing the organic thin film transistor according to the present invention.

Next, as shown in FIG. 6, in the transistor forming step, the transistor element 18 is formed on the inorganic layer 16 of the transfer type gas barrier film 40a.

As described above, the transistor element 18 includes the gate electrode 20, the insulating film 22, the organic semiconductor layer 24, the source electrode 26, and the drain electrode 28. As described above, each of the components in the transistor element 18 can be formed using the well-known method in the related art.

Figure 7:
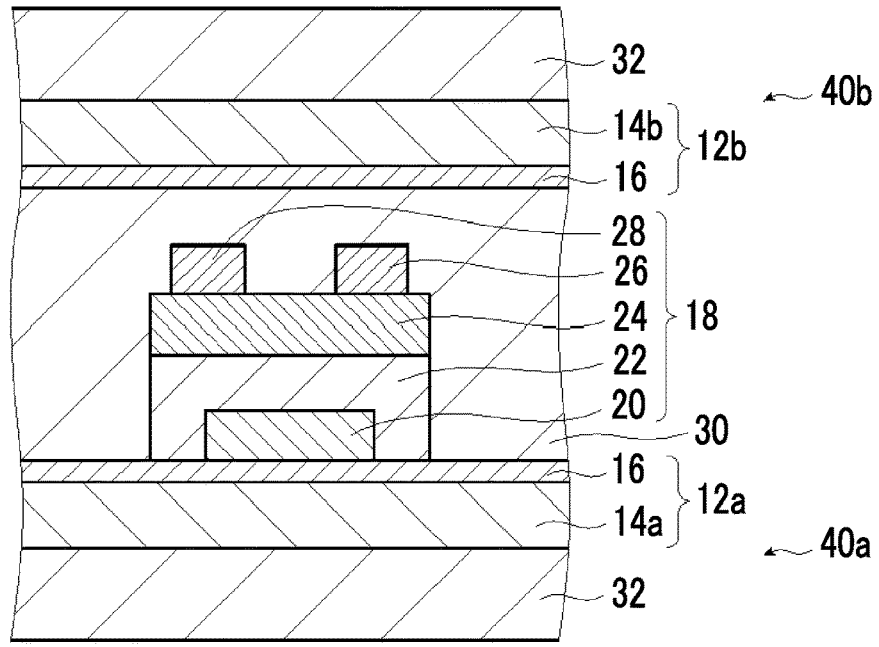
FIG. 7 is a diagram showing the example of the method of manufacturing the organic thin film transistor according to the present invention.

Next, as shown in FIG. 7, in the bonding step, a transfer type gas barrier film 40b including the substrate 32 and the second gas barrier layer 12b is bonded to the transfer type gas barrier film 40a in which the transistor element 18 is formed through the adhesive layer 30. During bonding, the inorganic layer 16 side of the second gas barrier layer 12b faces the transistor element 18. The transfer type gas barrier film 40b has the same configuration as the transfer type gas barrier film 40a.

The adhesive layer 30 may be laminated on the surface of the transfer type gas barrier film 40b on the inorganic layer 16 side in advance, or may be formed by applying an adhesive for forming the adhesive layer 30 to the transfer type gas barrier film 40a in which the transistor element 18 is formed, bonding the transfer type gas barrier film 40b to the adhesive, and curing the adhesive.

In a case where the adhesive layer 30 is laminated on the surface of the transfer type gas barrier film 40b on the inorganic layer 16 side in advance, the transfer type gas barrier film 40a abuts against the transfer type gas barrier film 40b such that the adhesive layer 30 side faces the transistor element 18, the substrate 32 side is heated such that the adhesive layer 30 flows to exhibit adhesiveness, and the adhesive layer 30 is cured again. As a result, the transfer type gas barrier film 40b can be bonded.

Figure 8:
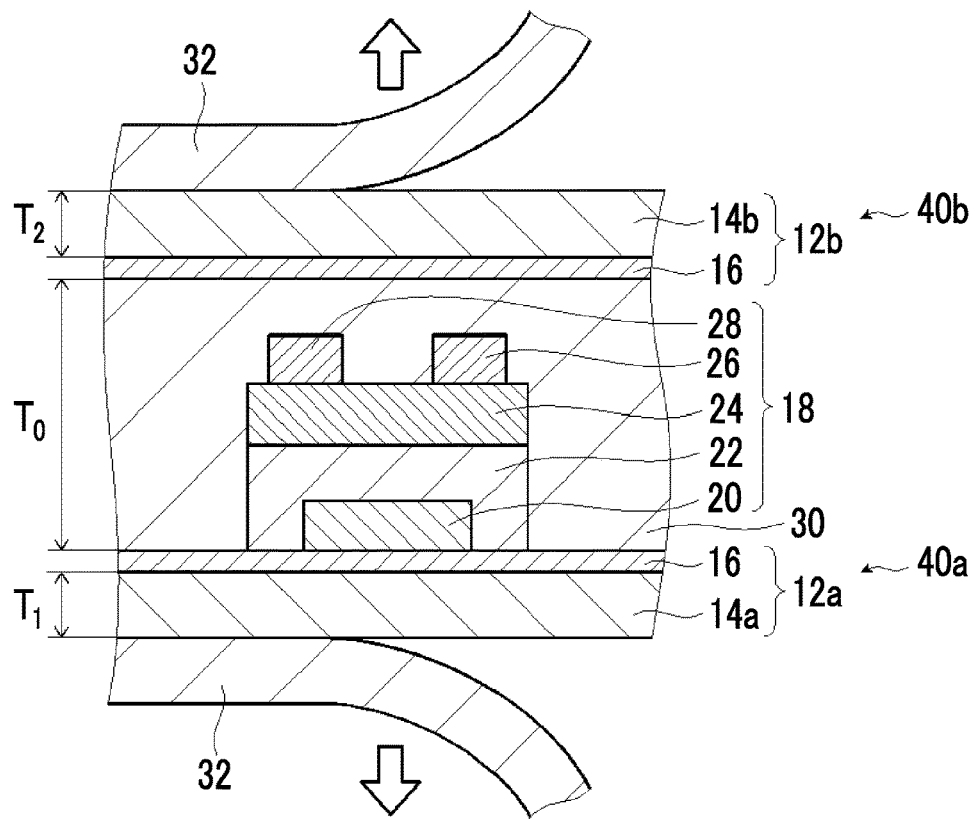
FIG. 8 is a diagram showing the example of the method of manufacturing the organic thin film transistor according to the present invention.

Next, as shown in FIG. 8, in the peeling step, the substrates 32 of the transfer type gas barrier film 40a and the transfer type gas barrier film 40b are peeled from each other.

Here, in the method of manufacturing the organic thin film transistor according to the embodiment of the present invention, in the bonding step, the transfer type gas barrier film 40b is bonded such that the thickness $T_1$ of the first resin layer 14a in the first gas barrier layer 12a is less than the thickness (the thickness of the adhesive layer 30) $T_0$ ranging from the inorganic layer 16 of the first gas barrier layer 12a to the inorganic layer 16 of the second gas barrier layer 12b.

In other words, during the preparation of the transfer type gas barrier film 40a, the thickness $T_1$ of the first resin layer 14a is formed to be less than the thickness $T_0$ of the adhesive layer 30.

As a result, the organic thin film transistor according to the embodiment of the present invention in which the thickness $T_1$ of the resin layer in the first gas barrier layer is less than the thickness $T_0$ ranging from the inorganic layer of the first gas barrier layer to the inorganic layer of the second gas barrier layer is prepared.

In the method of manufacturing the organic thin film transistor, the respective steps may be performed by R-to-R, or may be performed in a batch type using the cut transfer type gas barrier film. In addition, all of the preparation of the transfer type gas barrier film 40a and the transfer type gas barrier film 40b and the steps of the method of manufacturing the organic thin film transistor may be performed by a series of R-to-R.

In the above-described example, the method of manufacturing the organic thin film transistor in which both the upper side and the lower side of the transistor element 18 are sealed with the gas barrier layers 12, respectively, is described, but the present invention is not limited thereto.

For example, in a case where the surface where the transistor element 18 is to be formed is sealed with the gas barrier layer 12 and the upper side of the transistor element 18 is sealed with a well-known sealing layer in the related art through the adhesive layer 30, the well-known sealing layer in the related art may be used instead of the transfer type gas barrier film in the bonding step.

In a case where, in a case where the surface where the transistor element 18 is to be formed is sealed with a well-known sealing layer (support) in the related art and the upper side of the transistor element 18 is sealed with the gas barrier layer 12 through the adhesive layer 30, the well-known sealing layer in the related art may be used instead of the transfer type gas barrier film in the transistor forming step.

Hereinabove, the organic thin film transistor according to the embodiment of the present invention and the method of manufacturing the organic thin film transistor have been described in detail. However, the present invention is not limited to the above-described aspects, and various improvements or changes may be made within a range not departing from the scope of the present invention.

EXAMPLES

Hereinafter, the present invention will be described in detail using Examples. The present invention is not limited to the following specific examples.

Example 1

<Preparation of Transfer Type Gas Barrier Film>

A triacetyl cellulose (TAC) film (manufactured by Fujifilm Corporation, thickness: 80 μm, width: 1000 mm, length: 100 m) was used as the substrate 32, and the gas barrier layer 12 was formed on the substrate 32 in the following procedure.

(Formation of Resin Layer)

Polyarylate (manufactured by Unitika Ltd., UNIFINER (registered trade name) M-2000H) and cyclohexanone were prepared, were weighted at a weight ratio of 5:95, and were dissolved at a normal temperature to prepare a coating solution having a concentration of solid contents of 5%. Tg of the used polyarylate was 275° C. (catalog value).

This coating solution was applied to the above-described substrate by R-to-R using a die coater, and the substrate was allowed to pass through a drying zone at 130° C. for 3 minutes. Before contact with an initial film surface touch roll, a polyethylene (PE) protective film was bonded, and then the laminate was wound. The thickness of the resin layer 14 formed on the substrate 32 was 2 μm.

(Formation of Inorganic Layer)

The substrate was wound around a drum for film formation, and a silicon nitride film as the inorganic layer 16 was formed on the surface of the resin layer 14 using a general R-to-R CVD apparatus.

For example, the CVD apparatus includes a CCP-CVD film forming device, a drum as a facing electrode that winds and transports the substrate, a guide roller that peels the protective film laminated on the resin layer, a collection roll that winds the peeled protective film, a charging portion into which a roll of the elongated protective film is charged, and a guide roller that laminates the protective film on the surface of the formed inorganic layer. As the CVD apparatus, an apparatus including two or more film forming units (film forming devices) was used.

The substrate 32 on which the resin layer 14 was formed was unwound from the roll charged into the charging portion, the protective film was peeled after passing through a final film surface touch roll before film formation, and the inorganic layer 16 was formed on the exposed resin layer 14. In order to form the inorganic layer 16, two electrodes (film forming units) were used, and silane gas, ammonia gas, and hydrogen gas were used as raw material gases. In the first film forming unit, the amounts of supply of the raw material gases were silane gas: 150 sccm, ammonia gas: 300 sccm, and hydrogen gas: 500 sccm. In the second film forming unit, the amounts of supply of the raw material gases were silane gas: 150 sccm, ammonia gas: 350 sccm, and hydrogen gas: 500 sccm. In the first film forming unit and the second film forming unit, the plasma excitation power was 2.5 kW, and the frequency of the plasma excitation power was 13.56 MHz. A bias power of 0.5 kW having a frequency of 0.4 MHz was applied to the drum. In addition, the temperature of the drum was controlled to 30° C. by a cooling unit. The deposition pressure was 50 Pa. The PE protective film was bonded to the surface of the inorganic layer 16 immediately after the formation, and the laminate was wound. The thickness of the inorganic layer 16 was 20 nm.

Through the above-described steps, the elongated transfer type gas barrier film wound in a roll shape was prepared. The transfer type gas barrier films 40a and 40b having a size of 100×100 mm were cut from the elongated transfer type gas barrier film.

<Preparation of Transistor Element>

The transistor element 18 was prepared on the inorganic layer 16 of the transfer type gas barrier film 40a as follows.

(Formation of Gate Electrode)

The PE protective film was peeled from the transfer type gas barrier film 40a, and gold was vacuum-deposited on the exposed inorganic layer 16 to form the gate electrode 20. The gate electrode 20 had a width of 10 mm and a thickness of 50 nm.

(Formation of Insulating Film)

Cytop (registered trade name) and CTL-809M (concentration of solid contents: 9 wt %) manufactured by AGC Inc. were spin-coated to cover the gate electrode 20 and were dried at 150° C. to remove a solvent. As a result, the insulating film 22 (thickness: 200 nm) was formed.

(Formation of Organic Semiconductor Layer)

A toluene solution in which the organic semiconductor b shown below was dissolved at a concentration of 0.5 wt % was prepared. This solution was spin-coated on the insulating film 22 (at 500 rpm for 20 seconds and at 1000 rpm for 20 seconds), and the organic semiconductor layer 24 was formed such that the thickness of the layer after drying was 150 nm.

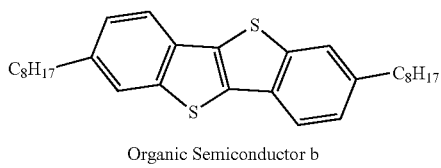

Organic Semiconductor b (Formation of Source Electrode and Drain Electrode)

Gold was vacuum-deposited on the organic semiconductor layer 24 to form the source electrode 26 and the drain electrode 28. In each of the source electrode 26 and the drain electrode 28, the channel length was 30 μm, the thickness was 50 nm, and the channel width was 10 mm.

Through the above-described steps, the transistor element 18 was prepared.

<Transfer of Second Gas Barrier Layer>

An OCA (manufactured by PANC Corporation) having a thickness of 5 μm was prepared as the adhesive layer 30 and was bonded to the transfer type gas barrier film 40a on which the transistor element 18 was formed. After peeling the protective film from the transfer type gas barrier film 40b, and the transfer type gas barrier film 40b was bonded such that the exposed inorganic layer 16 side faced the adhesive layer 30.

Next, the substrate 32 was peeled from each of the transfer type gas barrier films 40a and 40b.

Through the above-described steps, the organic thin film transistor in which the transistor element 18 was sealed between the two gas barrier layers 12 was prepared.

The thickness $T_1$ of the first resin layer 14a and the thickness $T_2$ of the second resin layer 14b were 2 μm, and the thickness $T_0$ of the adhesive layer 30 was 5 μm. In addition, a ratio $T_1/T_0$ of the thickness $T_1$ of the first resin layer 14a to the thickness $T_0$ of the adhesive layer 30 and a ratio $T_2/T_0$ of the thickness $T_2$ of the second resin layer 14b to the thickness $T_0$ of the adhesive layer 30 were 0.4.

Example 2

An organic thin film transistor was prepared using the same method as that of Example 1, except that the thickness $T_1$ of the first resin layer 14a and the thickness $T_2$ of the second resin layer were changed to 0.1 μm.

The ratio $T_1/T_0$ of the thickness $T_1$ of the first resin layer 14a to the thickness $T_0$ of the adhesive layer 30 and the ratio $T_2/T_0$ of the thickness $T_2$ of the second resin layer 14b to the thickness $T_0$ of the adhesive layer 30 were 0.02.

Example 3

An organic thin film transistor was prepared using the same method as that of Example 1, except that an OCA (manufactured by PANC Corporation) having a thickness of 3 μm was used as the adhesive layer.

The ratio $T_1/T_0$ of the thickness $T_1$ of the first resin layer 14a to the thickness $T_0$ of the adhesive layer 30 and the ratio $T_2/T_0$ of the thickness $T_2$ of the second resin layer 14b to the thickness $T_0$ of the adhesive layer 30 were 0.6.

Example 4

An organic thin film transistor was prepared using the same method as that of Example 3, except that the thickness $T_2$ of the second resin layer was changed to 5 μm.

That is, the thickness $T_2$ of the second resin layer was more than the thickness $T_0$ of the adhesive layer 30.

The ratio $T_1/T_0$ of the thickness $T_1$ of the first resin layer 14a to the thickness $T_0$ of the adhesive layer 30 was 0.6, and the ratio $T_2/T_0$ of the thickness $T_2$ of the second resin layer 14b to the thickness $T_0$ of the adhesive layer 30 were 1.7.

Example 5

An organic thin film transistor was prepared using the same method as that of Example 2, except that the thickness $T_2$ of the second resin layer was changed to 4 μm.

That is, the thickness $T_2$ of the second resin layer was more than the thickness $T_0$ of the adhesive layer 30.

The ratio $T_1/T_0$ of the thickness $T_1$ of the first resin layer 14a to the thickness $T_0$ of the adhesive layer 30 was 0.02, and the ratio $T_2/T_0$ of the thickness $T_2$ of the second resin layer 14b to the thickness $T_0$ of the adhesive layer 30 were 0.8.

Example 6

An organic thin film transistor was prepared using the same method as that of Example 1, except that the following gas barrier film was used instead of the second gas barrier layer.

An inorganic film (SiN film) was formed by CVD on a PEN film (manufactured by Teijin Ltd., TEONEX (registered trade name)) having a thickness of 4 μm using the same method as that of Example 1, and a gas barrier film was prepared. The thickness of the inorganic film was 20 nm.

Comparative Example 1

(Formation of Resin Layer)

An organic thin film transistor was prepared using the same method as that of Example 1, except that the thickness $T_1$ of the first resin layer 14a and the thickness $T_2$ of the second resin layer were changed to 10 μm.

The ratio $T_1/T_0$ of the thickness $T_1$ of the first resin layer 14a to the thickness $T_0$ of the adhesive layer 30 and the ratio $T_2/T_0$ of the thickness $T_2$ of the second resin layer 14b to the thickness $T_0$ of the adhesive layer 30 were 2.

[Evaluation]

<Carrier Mobility>

Regarding the organic thin film transistor according to each of Examples and Comparative Example prepared as described above, the carrier mobility was evaluated using the following method.

A voltage of −40 V was applied between the source electrode and the drain electrode, a gate voltage was caused to vary in a range of +40 V to −40 V, and a carrier mobility μ was calculated using the following expression indicating a drain current Id.

$$Id=(w/2L)\mu Ci(Vg-Vth)^2$$

(in the expression, L represents a gate length, w represents a gate width, Ci represents a volume of the insulating layer per unit area, Vg represents a gate voltage, and Vth represents a threshold voltage)

<Durability>

After leaving the organic thin film transistor according to each of Examples and Comparative Example to stand in an environment of temperature: 85° C. and a relative humidity: 85% RH for 500 hours, the carrier mobility was measured (durability: 500 hr).

In addition, after leaving the organic thin film transistor according to each of Examples and Comparative Example to stand in an environment of temperature: 85° C. and a relative humidity: 85% RH for 1000 hours, the carrier mobility was also measured (durability: 1000 hr).

<Bendability>

After outwardly bending the organic thin film transistor according to each of Examples and Comparative Example by φ8 mm 100,000 times, the carrier mobility was measured as described above.

The results are shown in the following table.

TABLE 1

| | Adhesive Layer | First Resin Layer | | Second Resin Layer | | Evaluation | | | |
|---|---|---|---|---|---|---|---|---|---|
| | Thickness | Thickness | Ratio | Thickness | Ratio | Carrier | Durability | | |
| | $T_0$ (μm) | $T_2$ (μm) | $T_1/T_0$ | $T_1$ (μm) | $T_2/T_0$ | Mobility | 500 hr | 1000 hr | Bendability |
| Example 1 | 5 | 2 | 0.4 | 2 | 0.4 | 0.08 | 0.070 | 0.059 | 0.050 |
| Example 2 | 5 | 0.1 | 0.02 | 0.1 | 0.02 | 0.08 | 0.079 | 0.075 | 0.080 |
| Example 3 | 3 | 2 | 0.6 | 2 | 0.6 | 0.08 | 0.075 | 0.065 | 0.060 |
| Example 4 | 3 | 2 | 0.6 | 5 | 1.7 | 0.08 | 0.055 | 0.038 | 0.030 |
| Example 5 | 5 | 0.1 | 0.02 | 4 | 0.8 | 0.08 | 0.052 | 0.042 | 0.040 |
| Example 6 | 5 | 2 | 0.4 | — | — | 0.08 | 0.048 | 0.022 | 0.020 |
| Comparative Example 1 | 5 | 10 | 2 | 10 | 2 | 0.08 | 0.045 | 0.020 | 0.003 |

It can be seen from Table 1 that, even in a case where the organic thin film transistor according to the embodiment of the present invention is left to stand in a high-temperature and high-humidity environment, a decrease in carrier mobility is small, and the stability in air is high as compared to Comparative Example. In addition, it can be seen that, after the bending test, a decrease in carrier mobility is small, and the bendability is high.

In addition, it can be seen from a comparison between Example 1 and Example 6 that it is preferable that both the sides of the transistor element are sealed with the gas barrier layer consisting of the resin layer and the inorganic layer, respectively.

In addition, it can be seen from a comparison between Example 3 and Example 4 that it is preferable that the thicknesses ($T_1$, $T_2$) of the resin layers in the gas barrier layers on both the sides of the transistor element are less than the thickness $T_0$ of the adhesive layer.

In addition, it can be seen from a comparison between Examples 1 to 5 that the ratio of the thickness of the resin layer to the thickness of the adhesive layer is preferably 0.01 to 0.9 and more preferably 0.6 or lower.

As can be seen from the above results, the effects of the present invention are obvious.

EXPLANATION OF REFERENCES 10, 10a to 10d: organic thin film transistor
12a: first gas barrier layer
12b: second gas barrier layer
14, 14a to 14d: resin layer
16: inorganic layer
18: transistor element
20: gate electrode
22: insulating film
24: organic semiconductor film
26: source electrode
28: drain electrode
30: adhesive layer
32: peelable substrate
40a, 40b: transfer type gas barrier film

What is claimed is:

1. An organic thin film transistor comprising:
a gas barrier layer consisting of a resin layer and an inorganic layer;
a transistor element that is formed on one main surface side of the gas barrier layer and includes a gate electrode, an insulating film, an organic semiconductor layer, a source electrode, and a drain electrode; and
a sealing layer that is laminated on a side of the transistor element opposite to the gas barrier layer through an adhesive layer,
wherein a thickness of the resin layer in the gas barrier layer is less than a thickness ranging from the inorganic layer to the sealing layer in the gas barrier layer, and
a substrate that is peelable from the gas barrier layer is provided on a surface of the as barrier layer opposite to the transistor element.

2. The organic thin film transistor according to claim 1, wherein the sealing layer is a gas barrier layer consisting of a resin layer and an inorganic layer,
a thickness of the resin layer in at least one of the gas barrier layers on both sides of the transistor element is less than a thickness ranging from the inorganic layer of one gas barrier layer to the inorganic layer of another gas barrier layer.

3. The organic thin film transistor according to claim 2, wherein thicknesses of the resin layers in the gas barrier layers on both sides of the transistor element are less than the thickness ranging from the inorganic layer of one gas barrier layer to the inorganic layer of another gas barrier layer.

4. The organic thin film transistor according to claim 2, wherein a ratio of the thickness of the resin layer in the gas barrier layer to the thickness ranging from the inorganic layer to the sealing layer in the gas barrier layer is in a range of 0.01 to 0.9.

5. The organic thin film transistor according to claim 2, wherein the inorganic layer of the gas barrier layer consists of silicon nitride.

6. The organic thin film transistor according to claim 2, wherein a thickness of the inorganic layer in the gas barrier layer is 50 nm or less.

7. The organic thin film transistor according to claim 2, wherein the thickness of the resin layer in the gas barrier layer is in a range of 0.1 µm to 2 µm.

8. The organic thin film transistor according to claim 2, wherein a thickness of the adhesive layer is in a range of 2.1 µm to 10 µm.

9. The organic thin film transistor according to claim 2, wherein a glass transition temperature of the resin layer in the gas barrier layer is 200° C. or higher.

10. The organic thin film transistor according to claim 1, wherein a ratio of the thickness of the resin layer in the gas barrier layer to the thickness ranging trom the inorganic layer to the sealing layer in the gas barrier layer is in a range of 0.01 to 0.9.

11. The organic thin film transistor according to claim 1, wherein the inorganic layer of the gas barrier layer consists of silicon nitride.

12. The organic thin film transistor according to claim 1, wherein a thickness of the inorganic layer in the gas barrier layer is 50 nm or less.

13. The organic thin film transistor according to claim 1, wherein the thickness of the resin layer in the gas barrier layer is in a range of 0.1 µm to 2 µm.

14. The organic thin film transistor according to claim 1, wherein a thickness of the adhesive layer is in a range of 2.1 µm to 10 µm.

15. The organic thin film transistor according to claim 1, wherein a glass transition temperature of the resin layer in the gas barrier layer is 200° C. or higher.

16. The organic thin film transistor according to claim 1, wherein the resin layer in the gas barrier layer includes a bisphenol structure.

17. The organic thin film transistor according to claim 1, wherein the resin layer in the gas barrier layer includes polyarylate.

18. A method of manufacturing an organic thin film transistor, the method comprising:
a transistor forming step of forming a transistor element on a first gas barrier layer of a transfer type gas barrier film including a substrate and the first gas barrier layer, the transistor element including a gate electrode, an insulating film, an organic semiconductor layer, a source electrode, and a drain electrode, the first gas barrier layer including a resin layer and an inorganic layer, the resin layer being peel able from the substrate, and the inorganic layer being formed on the resin layer;
a bonding step of bonding a transfer type gas barrier film including a substrate and a second gas barrier layer to the transistor element through an adhesive layer, the second gas barrier layer including a resin layer and an inorganic layer, the resin layer being reelable from the substrate, the inorganic layer being formed on the resin layer, and the transfer type gas barrier film being bonded such that the inorganic layer side faces the transistor element; and
a peeling step of peeling the substrate from each of the two transfer type gas barrier films,
wherein in the bonding step, the transfer type gas barrier film is bonded such that at least one of a thickness of the resin layer in the first gas barrier layer or a thickness of the resin layer in the second gas barrier layer is less than a thickness ranging from the inorganic layer of the first gas barrier layer to the inorganic layer of the second gas barrier layer.

* * * * *